United States Patent
Kim

(10) Patent No.: US 8,084,803 B2
(45) Date of Patent: Dec. 27, 2011

(54) CAPACITOR AND METHOD OF MANUFACTURING THE SAME

(75) Inventor: Nam-Joo Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 335 days.

(21) Appl. No.: 12/344,490

(22) Filed: Dec. 27, 2008

(65) Prior Publication Data

US 2009/0166698 A1 Jul. 2, 2009

(30) Foreign Application Priority Data

Dec. 27, 2007 (KR) .................. 10-2007-0139210

(51) Int. Cl.
*H01L 27/108* (2006.01)
*H01L 29/94* (2006.01)

(52) U.S. Cl. . 257/303; 257/306; 257/516; 257/E29.343; 257/E27.034

(58) Field of Classification Search .............. 257/303, 257/306, 307, 516, 535, 296, E29.343, E29.45, 257/E27.016, E27.03, E27.033, E27.034, 257/E27.048, E27.071
See application file for complete search history.

(56) References Cited

U.S. PATENT DOCUMENTS 6,777,732 B1 * 8/2004 Prall et al. .................... 257/296

* cited by examiner

*Primary Examiner* — Wael Fahmy
*Assistant Examiner* — Quovaunda V Jefferson
(74) *Attorney, Agent, or Firm* — Sherr & Vaughn, PLLC

(57) ABSTRACT

A capacitor with a mixed structure of a Metal Oxide Semiconductor (MOS) capacitor and a Poly-silicon Insulator Polysilicon (PIP) capacitor includes a substrate and a diffusion junction region formed over the substrate. A high concentration diffusion junction region may be formed in a portion of the diffusion junction region. An oxide layer may be formed over the substrate, the oxide layer having an opening that exposes a portion of the high concentration diffusion junction region. A first polysilicon plate may be formed over a portion of the oxide layer and spaced from the opening, and a nitride layer may be formed over a portion of the first polysilicon plate. A sidewall may be formed over a side of the first polysilicon layer, over a side of the nitride layer, and over a portion of the oxide layer between the side of the polysilicon layer and the opening. A second polysilicon plate may be formed over the nitride layer, over the sidewall, and over the high concentration diffusion junction region.

9 Claims, 3 Drawing Sheets

CAPACITOR AND METHOD OF MANUFACTURING THE SAME

The present application claims priority under 35 U.S.C. 119 to Korean Patent Application No. 10-2007-0139210 (filed on Dec. 27, 2007), which is hereby incorporated by reference in its entirety.

BACKGROUND

Integrated capacitors may be largely classified into Metal Oxide Semiconductor (MOS) capacitors, Poly-silicon Insulator Poly-silicon (PIP) capacitors, and a Metal Insulator Metal (MIM) capacitors. Integrated capacitors may be realized within a single device. However, to create a capacitor with a large capacity in a small mounting area, two kinds of capacitors may be connected and used as a single device. An example follows.

FIG. 1 is a cross-sectional view illustrating a structure with a PIP capacitor and a MOS capacitor. In FIG. 1, the left of a reference line A is a region (hereinafter, referred to a first region) of the PIP capacitor and the right is a region of the MOS capacitor (hereinafter, referred to as a second region). The capacitor, having a separated structure, includes a diffusion junction region 11 over a substrate 10, an oxide layer 13 over an entire surface of the substrate 10, a high concentration junction region 12 in a portion of the oxide layer 13 of the second region, first polysilicon layer 14 over the oxide layer 13 and spaced apart from each other in the first region and the second region, a nitride layer 15 over the first polysilicon electrode 14 of the first region, a second polysilicon layer 16 over the nitride layer 15, an insulation layer 17, contact plugs 18a, 18b, 18c, and 18d, and a metal electrode 19. Accordingly, two contact plugs 18c and 18d for forming an electrode of the PIP capacitor and two contact plugs 18a and 18b for forming an electrode of the MOS capacitor, i.e., a total of 4 contact plugs, are formed.

FIG. 2 is a cross-sectional view illustrating a mixed structure of a PIP capacitor and a MOS capacitor. Referring to FIG. 2, a capacitor with a mixed structure includes a substrate 20, a diffusion junction region 21, an oxide layer 23, a high concentration junction region 22, a first polysilicon layer 24, a nitride layer 25, a second polysilicon layer 26, an insulation layer 27, contact plugs 28a, 28b, and 28c, and a metal electrode 29.

A difference between the capacitor of a mixed structure and the capacitor of a separated structure is as follows. First, the first polysilicon layer 24 is not spaced apart and is formed of a single body. That is, in FIG. 1, the first polysilicon layer 14 may be used as an upper electrode of the MOS capacitor, and the first polysilicon layer 14 may also be used as a lower electrode of the PIP capacitor in the separated structure, but in FIG. 2, these are integrated into the first polysilicon layer 24 in the mixed structure.

Second, as the first polysilicon layer 24 is integrated into one body, the top contact plug 18c of the PIP capacitor and the top contact plug 18b of the MOS capacitor in the separated structure shown in FIG. 1 are integrated into the single contact plug 28b in the mixed structure shown in FIG. 2. Third, the contact plug 28b (i.e., the single contact plug) of the second polysilicon layer 26 and the contact plug 28a of the high concentration junction region 22 used as a terminal of the lower metal layer (i.e., the diffusion junction region 21) of the MOS capacitor are connected to a single electrode 29.

The number of electrodes and contact plugs and a mounting area of a capacitor can be reduced in the mixed structure, compared to the separated structure. However, since the high concentration junction region 22 has a structure of the contact plug 28a in the mixed structure, there are limitations in reducing the number of contact plugs and the size of the high concentration junction region 22.

SUMMARY

Embodiments relate to a capacitor and a method of fabricating the same. The capacitor reduces the number contact plugs and the size of a high concentration junction region used as a lower metal layer terminal of a MOS capacitor through improvement of a related art mixed structure of a PIP capacitor and a MOS capacitor.

In embodiments, a capacitor with a mixed structure of a Metal Oxide Semiconductor (MOS) capacitor and a Poly-silicon Insulator Poly-silicon (PIP) capacitor includes a substrate and a diffusion junction region formed over the substrate. A high concentration diffusion junction region may be formed in a portion of the diffusion junction region. An oxide layer may be formed over the substrate, the oxide layer having an opening that exposes a portion of the high concentration diffusion junction region. A first polysilicon plate may be formed over a portion of the oxide layer and spaced from the opening, and a nitride layer may be formed over a portion of the first polysilicon plate. A sidewall may be formed over a side of the first polysilicon layer, over a side of the nitride layer, and over a portion of the oxide layer between the side of the polysilicon layer and the opening. A second polysilicon plate may be formed over the nitride layer, over the sidewall, and over the high concentration diffusion junction region.

In embodiments, a method of fabricating a capacitor may include: forming a diffusion junction region over a substrate; forming an oxide layer over the substrate; forming a high concentration diffusion junction region in a portion of the diffusion junction region through an ion implantation process; forming a first polysilicon plate over a portion of the oxide layer, the polysilicon plate spaced from the high concentration diffusion junction; forming a nitride layer over the polysilicon plate, the nitride layer spaced from the high concentration diffusion junction; forming a sidewall over a side of the first polysilicon layer, over a side of the nitride layer, and over a portion of the oxide layer between the side of the polysilicon layer and the high concentration diffusion junction; forming an opening in the oxide layer to expose the high concentration diffusion junction region; forming a polysilicon layer over the nitride layer, the sidewall, and the high concentration diffusion junction; and forming a second polysilicon plate by partially removing the nitride layer and the polysilicon layer through an etching process which also exposes an end portion of the first polysilicon plate.

DRAWINGS

Figure 1:
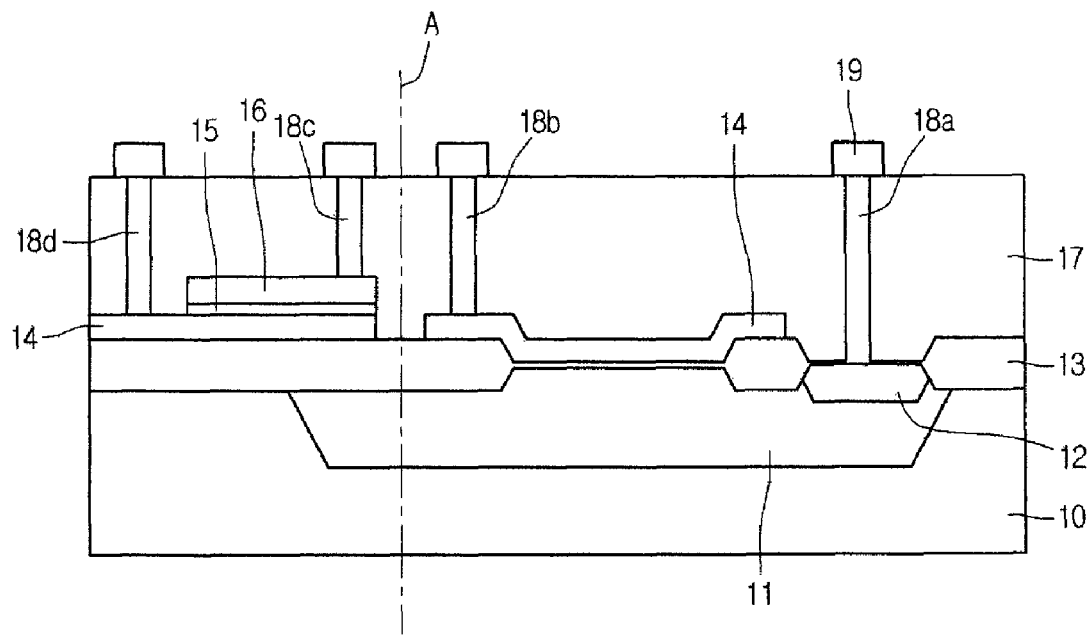
FIG. 1 is a cross-sectional view illustrating a structure where a PIP capacitor and a MOS capacitor are separated.
Figure 2:
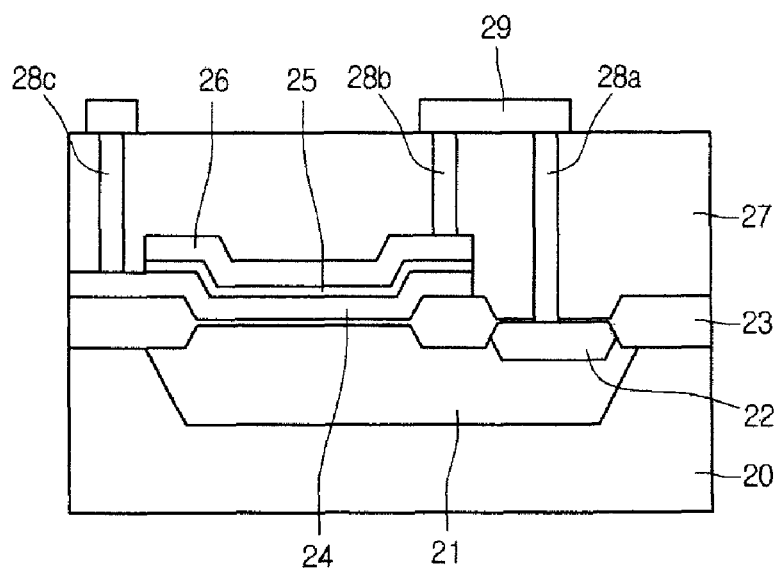
FIG. 2 is a cross-sectional view illustrating a mixed structure of a PIP capacitor and a MOS capacitor.
Figure 3:
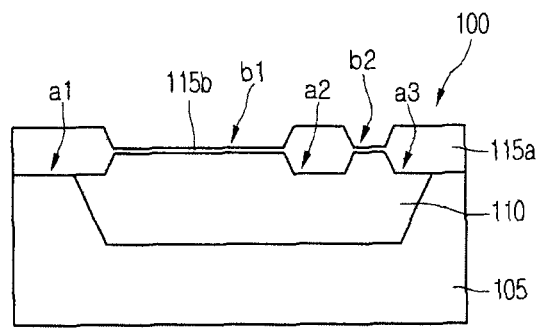

Example FIG. 3 is a cross-sectional view illustrating the structure of a capacitor after oxide layers are formed.

Figure 4:
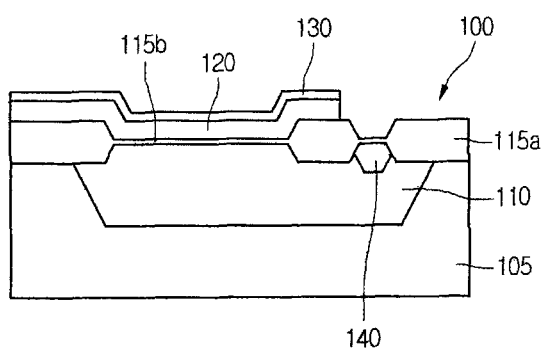

Example FIG. 4 is a cross-sectional view illustrating the structure of a capacitor after a high concentration diffusion junction region is formed.

Figure 5:
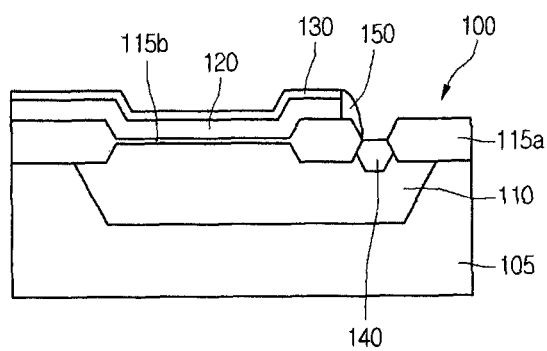

Example FIG. 5 is a cross-sectional view illustrating the structure of a capacitor after a sidewall is formed.

Figure 6:
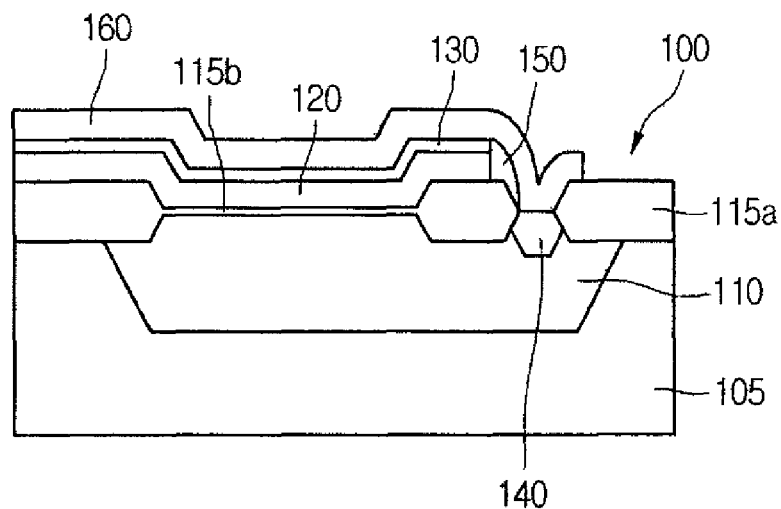

Example FIG. 6 is a cross-sectional view illustrating the structure of a capacitor after a second polysilicon is formed.

Figure 7:
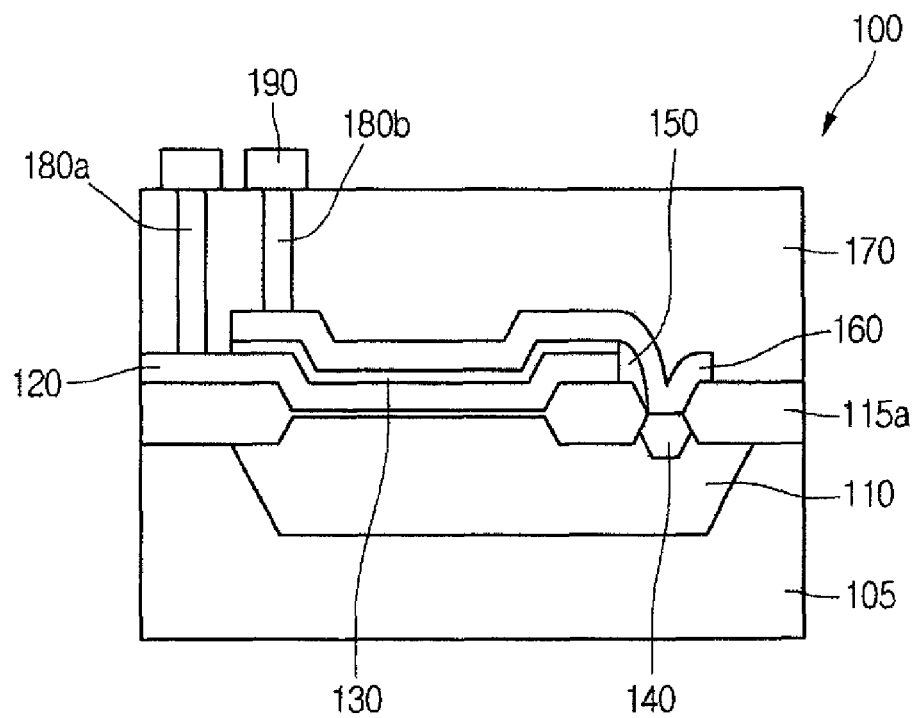

Example FIG. 7 is a cross-sectional view illustrating the structure of a capacitor after a metal electrode is formed.

DESCRIPTION

A capacitor and a method of fabricating the same will be described in more detail with reference to the accompanying drawings. In a capacitor according to embodiments, a MOS capacitor and a PIP capacitor have a mixed structure through a single process.

Example FIG. 3 is a cross-sectional view illustrating a structure of a capacitor 100 after oxide layers 115a and 115b are formed. First, a diffusion junction region 110 may be formed over a substrate 105. Then, the substrate 105 may be patterned to form a trench structure.

The substrate 105 may include three trenches. A trench at the left may be referred to as a first trench a1, a trench in the middle may be referred to as a second trench a2, and a trench at the right may be referred to as a third trench a3. The diffusion junction region 110 may serve as a lower conductive plate of a MOS capacitor.

Next, an oxide layer may be formed over the substrate 105 and may be patterned to be symmetric to the above trench structure. In other words, trenches in the oxide layer may be formed over plateaus in the substrate, and plateaus in the oxide layer are formed over trenches in the substrate. Accordingly, a trench formed in the substrate 105 and a trench having a reverse structure may be formed in the patterned oxide layer 115a and 115b. Accordingly, the patterned oxide layers 115a and 115b may have structures symmetric (or opposite) to the trenches a1, a2, and a3 in the substrate 105.

Hereinafter, among the trenches formed by the oxide layers 115a and 115b, a broad trench at the left may be referred to as a fourth trench b1 and a narrow trench at the right may be referred to as a fifth trench b2. The thick oxide layer 115a over the first trench a1, the second trench a2, and the third trench a3 serves as a field oxide layer. The thin oxide layer 115b at the bottom of the fourth trench b1 and the bottom of the fifth trench b2 serves as an interlayer dielectric.

Example FIG. 4 is a cross-sectional view illustrating the structure of the capacitor 100 after a high concentration diffusion junction region 140 is formed. Once the oxide layers 115a and 115b are formed, a first polysilicon layer 120 and a nitride layer 130 may be deposited thereon, and then patterned to expose the fifth trench b2. At this point, a spaced region including the side of the fifth trench b2 may be formed between the fifth trench b2, the first polysilicon layer 120, and the nitride layer 130. The spaced region is a portion where a sidewall 150 of example FIG. 5 will be formed.

A patterning process according to embodiments may include a photoresist pattern process using a coating, developing and exposing process for a photoresist layer. The patterning process may further include an etching process, and a removal process for the photoresist pattern.

Next, using the patterned nitride layer 130 and the field oxide layer 115a of the second trench a2 and the third trench a3 as an ion implantation mask, a high concentration diffusion junction region 140 may be formed through an ion implantation process. Accordingly, the high concentration diffusion junction region 140 may be formed over only a region below the fifth trench b2. Additionally, the high concentration diffusion region 140 may be formed in the diffusion junction region 110.

The first polysilicon layer 120 may serve as a lower electrode layer or lower conductive plate of the PIP capacitor and an upper conductive plate of the MOS capacitor at the same time. Additionally, the nitride layer 130 may serve as a dielectric layer of the PIP capacitor and the high concentration diffusion junction region 140 may serve as a contact terminal (i.e., the diffusion junction region 110) for a lower conductive plate of the MOS capacitor.

Example FIG. 5 is a cross-sectional view illustrating a structure of the capacitor 100 after a sidewall 150 is formed. After the high concentration diffusion junction region 110 is formed, an oxide layer may be deposited over an entire surface of the substrate 115 and then an anisotropic etching process may be performed.

The anisotropic etching process removes the oxide layer except for an etching surface of the first polysilicon layer 120 and the nitride layer 130 and one side (the left) of the fifth trench b2. At this point, the thin oxide layer 115b over the fifth trench b2 may be removed and the high concentration diffusion junction region 140 may be exposed through the fifth trench b2. The oxide layer remaining over the etching surface of the first polysilicon 120 and the nitride layer 130 and one side of the fifth trench b2, which are the above-mentioned spaced region, may serve as the sidewall 150.

Example FIG. 6 is a cross-sectional view illustrating a structure of the capacitor 100 after a second polysilicon 160 is formed. A polysilicon layer may be deposited over an entire surface of the substrate 105 and a patterning process may be performed to form a second polysilicon layer 160. At this point, since the nitride layer 130 of the first trench a1 may be removed together, the first polysilicon 120 of the first trench a1 may be partially exposed.

Since the second polysilicon layer 160 may be formed from a portion of the first trench a1 to the fifth trench b2, it contacts the high concentration diffusion junction region 140. That is, the second polysilicon layer 160 contacting the high concentration diffusion junction region 140 may serve as a contact plug of a lower conductive layer (i.e., the diffusion junction region 110) of the MOS capacitor and also serves as an upper conductive layer of the PIP capacitor.

Example FIG. 7 is a cross-sectional view illustrating a structure of the capacitor 100 after a metal electrode 190 is formed. An interlayer dielectric 180 such as an oxide layer may be stacked over an entire surface of the substrate 105. The surface of the interlayer dielectric 180 may be planarized through a polishing process such as Chemical Mechanical Polishing (CMP).

Next, the interlayer dielectric 170 may be patterned to form a sixth trench reaching the first polysilicon layer 120 and to form a seventh trench reaching the second polysilicon layer 160. Once the sixth trench and the seventh trenches are formed, a first contact plug 180a and a second contact plug 180b may be formed by filling a metal material such as tungsten.

Next, the 100 capacitor with a mixed structure of example FIG. 7 may be completed by forming metal electrodes 190 connected to the first contact plug 180a and the second contact plug 180b, respectively.

Accordingly, the capacitor 100 with a mixed structure may reduce the number of contact plugs to two and also the size of the high concentration diffusion junction region 140. Therefore, a mounting area of a capacitor can be drastically reduced. According to embodiments, desired effects can be obtained as follows.

First, a second polysilicon layer serving as an upper conductive layer of a PIP capacitor can be used as a contact plug of a high concentration junction region serving as a lower conductive layer terminal of a MOS capacitor. Therefore, the number of contact plugs used in a capacitor with a mixed structure can be reduced. Second, since the high concentration junction region of the MOS capacitor does not depend on a contact structure, the size of the high concentration junction region can be reduced. Third, since the number of contact plugs and the size of a high concentration junction region can be reduced, the size of a capacitor with a mixed structure can be minimized. Fourth, manufacturing processes can be simplified and a manufacturing yield can be maximized due to an uncomplicated structure of a contact plug.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
    a substrate;
    a diffusion junction region formed over the substrate;
    a high concentration diffusion junction region formed in a portion of the diffusion junction region;
    an oxide layer formed over the substrate, the oxide layer having an opening that exposes a portion of the high concentration diffusion junction region;
    a first polysilicon plate formed over a portion of the oxide layer and spaced from the opening;
    a nitride layer formed over a portion of the first polysilicon plate;
    a sidewall formed over a side of the first polysilicon layer, over a side of the nitride layer, and over a portion of the oxide layer between the side of the polysilicon layer and the opening; and
    a second polysilicon plate formed over the nitride layer, over the sidewall, and over the high concentration diffusion junction region,
    wherein the nitride layer is disposed over a portion of the first polysilicon plate adjacent the sidewall, and exposes a portion of the first polysilicon plate opposite the sidewall.

2. The apparatus of claim 1, including:
    an interlayer dielectric formed over the exposed first polysilicon plate, the second polysilicon plate, and oxide layer; and
    a first contact plug contacting the exposed portion of the first polysilicon plate through the interlayer dielectric; and
    a second contact plug contacting the second polysilicon plate through the interlayer dielectric.

3. The apparatus of claim 1, wherein:
    a first trench, a second trench, and a third trench are formed in the substrate;
    a fourth trench is formed in an oxide layer between the first trench and the second trench;
    a fifth trench is formed in an oxide layer between the second trench and the third trench; and
    the opening is disposed in the fifth trench.

4. The apparatus of claim 3, wherein the first trench, the second trench, and the third trench have a structure opposite to that of the fourth trench and the fifth trench.

5. The apparatus of claim 3, wherein a thick oxide layer over the first trench, the second trench, and the third trench serves a field oxide layer, and a thin oxide layer below the fourth trench and the fifth trench serves as an interlayer dielectric.

6. The apparatus of claim 3, wherein the first polysilicon plate is formed over the first trench, a portion of the second trench, and the fourth trench, and spaced away from the fifth trench.

7. The apparatus of claim 3, wherein the nitride layer is disposed over at least the second trench and the fourth trench, and spaced away from the fifth trench.

8. The apparatus of claim 3, wherein the first polysilicon plate, the nitride layer, and the second polysilicon plate are disposed over at least the second trench.

9. The apparatus of claim 1, wherein:
    the diffusion junction region serves as a lower conductive plate of a metal-oxide-semiconductor capacitor;
    the first polysilicon plate serves as a lower conductive plate of a polysilicon-insulator-polysilicon capacitor and an upper conductive plate of a metal-oxide-semiconductor capacitor;
    the nitride layer serves as a dielectric layer of the polysilicon-insulator-polysilicon capacitor;
    the high concentration diffusion junction region serves as a contact terminal of the lower conductive plate of the metal-oxide-semiconductor capacitor; and
    the second polysilicon plate serves as a contact terminal of the lower conductive plate of the metal-oxide-semiconductor capacitor and as an upper conductive plate of the polysilicon-insulator-polysilicon capacitor.

* * * * *